(12) United States Patent
Kim

(10) Patent No.: US 7,982,511 B2
(45) Date of Patent: Jul. 19, 2011

(54) DLL CIRCUIT AND METHOD OF CONTROLLING THE SAME

(75) Inventor: Kyoung Nam Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 243 days.

(21) Appl. No.: 11/647,379

(22) Filed: Dec. 29, 2006

(65) Prior Publication Data

US 2007/0182471 A1    Aug. 9, 2007

(30) Foreign Application Priority Data

Feb. 9, 2006 (KR) .......... 10-2006-0012358
Jun. 29, 2006 (KR) .......... 10-2006-0059656

(51) Int. Cl.
*H03L 7/06* (2006.01)
(52) U.S. Cl. ............. 327/158; 327/156
(58) Field of Classification Search .......... 327/156, 327/158
See application file for complete search history.

(56) References Cited

U.S. PATENT DOCUMENTS

| | | | |
|---|---|---|---|
| 6,333,896 B1 | 12/2001 | Lee | |
| 6,621,315 B2 | 9/2003 | Heo et al. | |
| 6,977,848 B2 | 12/2005 | Choi | |
| 6,980,479 B2 | 12/2005 | Park | |
| 6,982,579 B2 * | 1/2006 | Lee | 327/158 |
| 7,027,352 B2 | 4/2006 | Jung | |
| 2003/0111676 A1 * | 6/2003 | Cho et al. | 257/235 |
| 2006/0120207 A1 | 6/2006 | Lee | |
| 2006/0132203 A1 | 6/2006 | Lee | |

FOREIGN PATENT DOCUMENTS

| | | |
|---|---|---|
| JP | 2005116167 | 4/2005 |
| JP | 2005243168 | 9/2005 |
| KR | 1019900012458 | 8/1990 |
| KR | 1020010008836 | 2/2001 |
| KR | 1020010030308 | 6/2001 |
| KR | 1020030078307 | 10/2003 |
| KR | 100757921 | 9/2007 |

* cited by examiner

*Primary Examiner* — Lincoln Donovan
*Assistant Examiner* — Diana J Cheng
(74) *Attorney, Agent, or Firm* — Venable LLP; Jeffri A. Kaminski

(57) ABSTRACT

A delayed lock loop (DLL) circuit includes: a phase conversion control unit configured to latch an initial value of a phase comparison signal, and output the latched signal as a phase conversion control signal. A phase converting unit configured to control the phase of a delay clock on the basis of the phase conversion control signal, and transmit the controlled delay clock to a delay compensating unit.

17 Claims, 9 Drawing Sheets

DLL CIRCUIT AND METHOD OF CONTROLLING THE SAME

CROSS-REFERENCE TO RELATED APPLICATIONS

This U.S. non-provisional patent application claims priority under 35 U.S.C. §119 of Korean Patent Applications No. 2006-012358 filed on Feb. 9, 2006, No. 2006-059656 filed on Jun. 29, 2006, the entire contents of which are hereby incorporated by reference.

BACKGROUND

1. Technical Field

The present invention relates to a delay locked loop (DLL) circuit and a method of controlling the same, and more particularly, to a DLL circuit and a method of controlling the same capable of shortening a clock delay locking time and reducing a device area.

2. Related Art

In general, DLL circuits are used to provide an internal clock, whose phase leads the phase of a reference clock, by converting an external clock by a predetermined amount of time. Generally, the internal clock is generated to operate in synchronization with data in a semiconductor memory apparatus having a high degree of integration, such as a Synchronous Dynamic Random Access Memory (SDRAM).

More specifically, when an external clock is input to a clock input buffer by an input pin, the clock input buffer generates an internal clock. Then, the internal clock controls a data output buffer which outputs data. The internal clock is delayed from the external clock by a predetermined amount of time by the clock input buffer, and the data output from the data output buffer is also delayed by a predetermined amount of time.

Therefore, the output data is delayed as compared with the external clock by a large amount of time. That is, the output data access time required to output data after the external clock is input is prolonged.

In order to solve this problem, a DLL circuit is used to make the phase of the internal clock lead the phase of the external clock by a predetermined amount of time. As a result, data is output without being delayed as compared with the external clock. That is, the DLL circuit receives an external clock and generates an internal clock whose phase leads the phase of the external clock by a predetermined amount of time, and the internal clock is used as a reference clock in, for example, a data output buffer.

Next, a DLL circuit according to the related art will be described with reference to the accompanying drawings.

FIG. 1 is a block diagram of a DLL circuit according to the related art.

As shown in FIG. 1, a DLL circuit 1 includes: a clock buffer 10 that changes the amplitude of an external clock clk_ext, to generate a reference clock clk_ref; a delay unit 20 that delays the reference clock clk_ref in a push or pull manner in response to the input of a delay control signal dcl to generate a delay clock clk_dly, and transmits the generated delay clock clk_dly to a data output buffer 30 so as to synchronize with data transmitted from a memory cell; a delay compensating unit 40 that delays the delay clock clk_dly to generate a feedback clock clk_fb in order to compensate for a delay time produced by delay elements provided on a transmission path of the delay clock clk_dly to the outside of a semiconductor integrated circuit; a phase comparing unit 50 that compares the phase of the reference clock clk_ref with the phase of the feedback clock clk_fb to generate a phase comparison signal pcm; and a delay control unit 60 that generates the delay control signal dcl on the basis of the phase comparison signal pcm and transmits the delay control signal dcl to the delay unit 20.

When the external clock clk_ext is transmitted to the clock buffer 10 of the semiconductor integrated circuit having the DLL circuit 1, the clock buffer 10 changes the external clock clk_ext having a small amplitude into the reference clock clk_ref having a large amplitude, and transmits the reference clock clk_ref to the delay unit 20. Then, the delay unit 20 delays the reference clock clk_ref by a predetermined amount of time and outputs the delayed clock as the delay clock clk_dly.

The delay compensating unit 40 has pre-calculated delay values of delay elements provided on a path through which the delay clock clk_dly transmitted from the delay unit 20 is transmitted to the data output buffer 30. Therefore, the delay compensating unit 40 gives a predetermined delay time, for compensating for the delay values of the delay elements, to the delay clock clk_dly to generate the feedback clock clk_fb. Then, the phase comparing unit 50 detects the phase difference between the reference clock clk_ref and the feedback clock clk_fb to generate the phase comparison signal pcm. The delay control unit 60 generates the delay control signal dcl in response to the input of the phase comparison signal pcm to instruct the delay unit 20 to perform a push or pull delay operation. The delay unit 20 gives a positive or negative delay time to the reference clock clk_ref on the basis of the delay control signal dcl.

FIGS. 2A to 2C are timing charts illustrating the operation of the DLL circuit shown in FIG. 1.

The reference clock clk_ref, the feedback clock clk_fb, and a locked clock having a rising edge time identical to those of the reference clock clk_ref and the feedback clock clk_fb are shown in FIGS. 2A to 2C.

FIG. 2A shows the feedback clock clk_fb whose phase leads the phase of the reference clock clk_ref when the external clock clk_ext is a high-frequency signal. In this case, a phase difference Trf between the reference clock clk_ref and the feedback clock clk_fb is larger than a phase difference Tfl between the feedback clock clk_fb and the locked clock.

FIG. 2B shows the reference clock clk_ref whose phase leads the phase of the feedback clock clk_fb when the external clock clk_ext is a high-frequency signal. In this case, the phase difference Trf between the reference clock clk_ref and the feedback clock clk_fb is smaller than the phase difference Tfl between the feedback clock clk_fb and the locked clock. That is, in FIG. 2B, the phase difference Tfl between the feedback clock clk_fb and the locked clock is larger than that shown in FIG. 2A, and thus a larger amount of delay time should be given to the reference clock clk_ref until the phase difference Tfl between the feedback clock clk_fb and the locked clock is zero.

FIG. 2C shows the waveforms of the reference clock clk_ref and the feedback clock clk_fb when a low-frequency external clock clk_ext is input to the DLL circuit for generating the reference clock clk_ref and the feedback clock clk_fb. In this case, the phase difference Trf between the reference clock clk_ref and the feedback clock clk_fb is the same as shown in FIG. 2A. This is because the delay time given to the reference clock clk_ref by the delay unit 20 and the delay time given to the delay clock clk_dly by the delay compensating unit 40 are the same regardless of the frequency. However, the phase difference Tfl between the feedback clock clk_fb and the fixed clock is considerably larger than that shown in FIG. 2A. That is, when a low-frequency clock is input to the DLL circuit, a larger amount of delay time should be given to the reference clock clk_ref until the phase difference Tfl between the feedback clock clk_fb and the locked clock is zero.

As described above, in the delay locking operation of the DLL circuit with respect to the internal clock, when the phase of the reference clock leads the phase of the feedback clock, a larger amount of delay time is given to the reference clock compared to when the phase of the feedback clock leads the phase of the reference clock. In addition, the lower the frequency of the external clock becomes, the larger the amount of delay time to be given to the reference clock by the delay unit becomes. When the amount of delay time given to the reference clock becomes large, it takes the DLL circuit a lot of time to perform a clock delay locking operation, resulting in the deterioration of the efficiency of the DLL circuit. In order to give the larger amount of delay time to the reference clock, a larger number of delay elements should be provided in the delay unit, which results in an increase in the occupation area of DLL circuit.

SUMMARY

Embodiments of the present invention provide a DLL circuit and a method of controlling the same, which reduces the amount of delay time given to lock a reference clock and a feedback clock, which reduces the number of delay elements provided in a delay unit, which results in an increase of an area margin.

In a first embodiment of the present invention, a DLL circuit includes: a phase conversion control unit configured to latch an initial value of a phase comparison signal, and output the latched signal as a phase conversion control signal; and a phase converting unit configured to control the phase of a delay clock on the basis of the phase conversion control signal, and transmit the controlled delay clock to a delay compensating unit.

In a second embodiment of the present invention, a DLL circuit includes: a phase conversion control unit configured to receive a phase comparison signal whose level is determined by the phase relationship between a reference clock and a feedback clock, and output a phase conversion control signal; and a phase converting unit configured to invert a delay clock when the phase of the reference clock leads the phase of the feedback clock, and output the delay clock without inversion when the phase of the feedback clock leads the phase of the reference clock on the basis of the phase conversion control signal.

In a third embodiment of the present invention, a DLL circuit includes: a phase conversion control unit configured to generate first and second phase conversion control signals according to whether the frequency of an external clock exceeds a predetermined frequency; and a phase converting unit configured to control the phase of a delay clock according to whether the first phase conversion control signal or the second phase conversion control signal is enabled, and transmit the controlled delay clock to a delay compensating unit.

In a fourth embodiment of the present invention, a DLL circuit includes: a phase conversion control unit configured to generate first and second phase conversion control signals according to whether or not a plurality of CAS latency signals generated according to the length of CAS latency or a plurality of test signals are enabled; and a phase converting unit configured to invert a delay clock when the length of the CAS latency is smaller than a predetermined length, and output the delay clock without inversion when the length of the CAS latency is equal to or larger than the predetermined length on the basis of the first and second phase conversion control signals.

In a fifth embodiment of the present invention, a method of controlling a DLL circuit includes: latching and driving a phase comparison signal in response to the input of a delay enable signal, and outputting the driven signal as a phase conversion control signal; and controlling the phase of a delay clock on the basis of the phase conversion control signal, and transmitting the controlled delay clock to a delay compensating unit.

In a sixth embodiment of the present invention, a method of controlling a DLL circuit includes: receiving a phase comparison signal whose level is determined by the phase relationship between a reference clock and a feedback clock, and outputting a phase conversion control signal; and inverting a delay clock when the phase of the reference clock leads the phase of the feedback clock and, outputting the delay clock without inversion when the phase of the feedback clock leads the phase of the reference clock on the basis of the phase conversion control signal.

In a seventh embodiment of the invention, a method of controlling a DLL circuit includes: generating first and second phase conversion control signals according to whether the frequency of an external clock is larger than a predetermined frequency; and controlling the phase of a delay clock according to whether the first phase conversion control signal or the second phase conversion control signal is enabled and outputting the controlled delay clock to a delay compensating unit.

In an eighth embodiment of the invention, a method of controlling a DLL circuit includes: generating first and second phase conversion control signals according to whether or not a plurality of CAS latency signals generated according to the length of CAS latency or a plurality of test signals are enabled; and inverting a delay clock when the length of the CAS latency is smaller than a predetermined length, and outputting the delay clock without inversion when the length of the CAS latency is equal to or larger than the predetermined length on the basis of the first and second phase conversion control signals.

DESCRIPTION OF EXEMPLARY EMBODIMENT

Exemplary embodiments of the present invention will now be described in detail with reference to the accompanying drawings.

Figure 1:
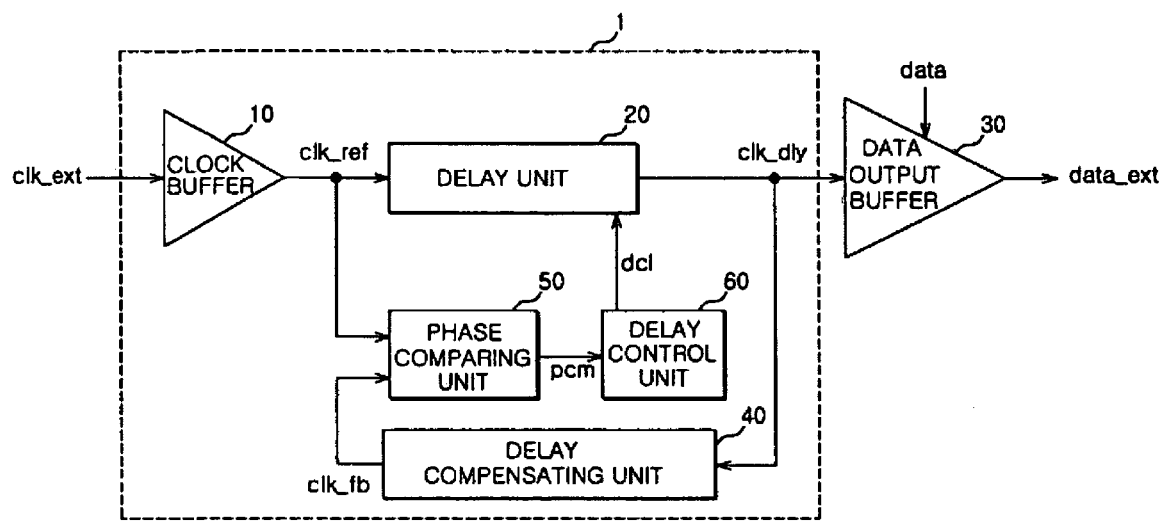
FIG. 1 is a block diagram of a DLL circuit according to the related art.
Figure 2A:
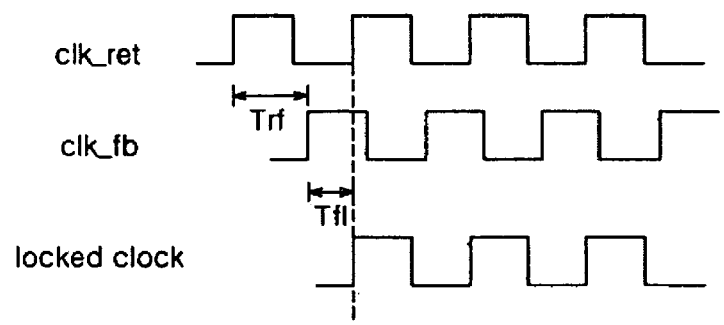
FIGS. 2A to 2C are timing charts illustrating the operation of the DLL circuit according to the related art.
Figure 2B:
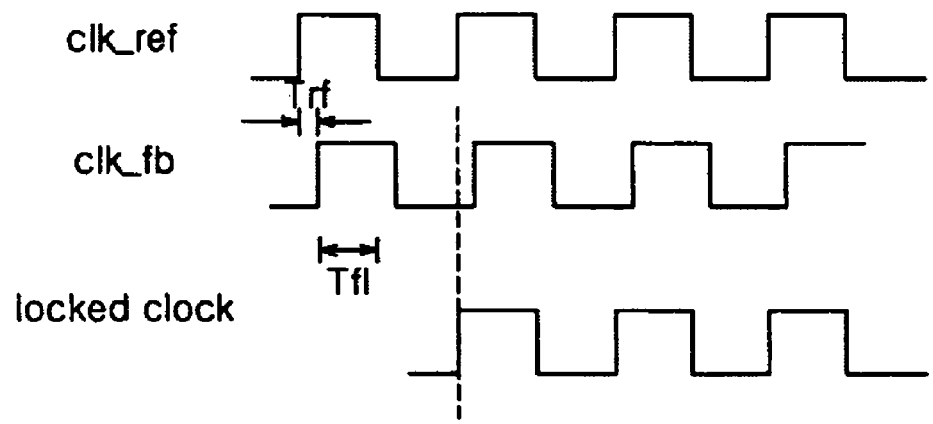
Figure 2C:
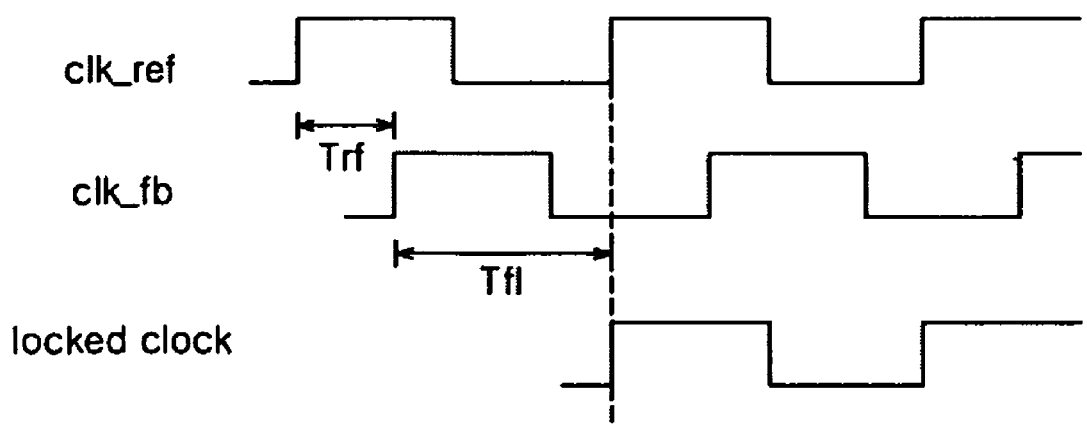
Figure 3:
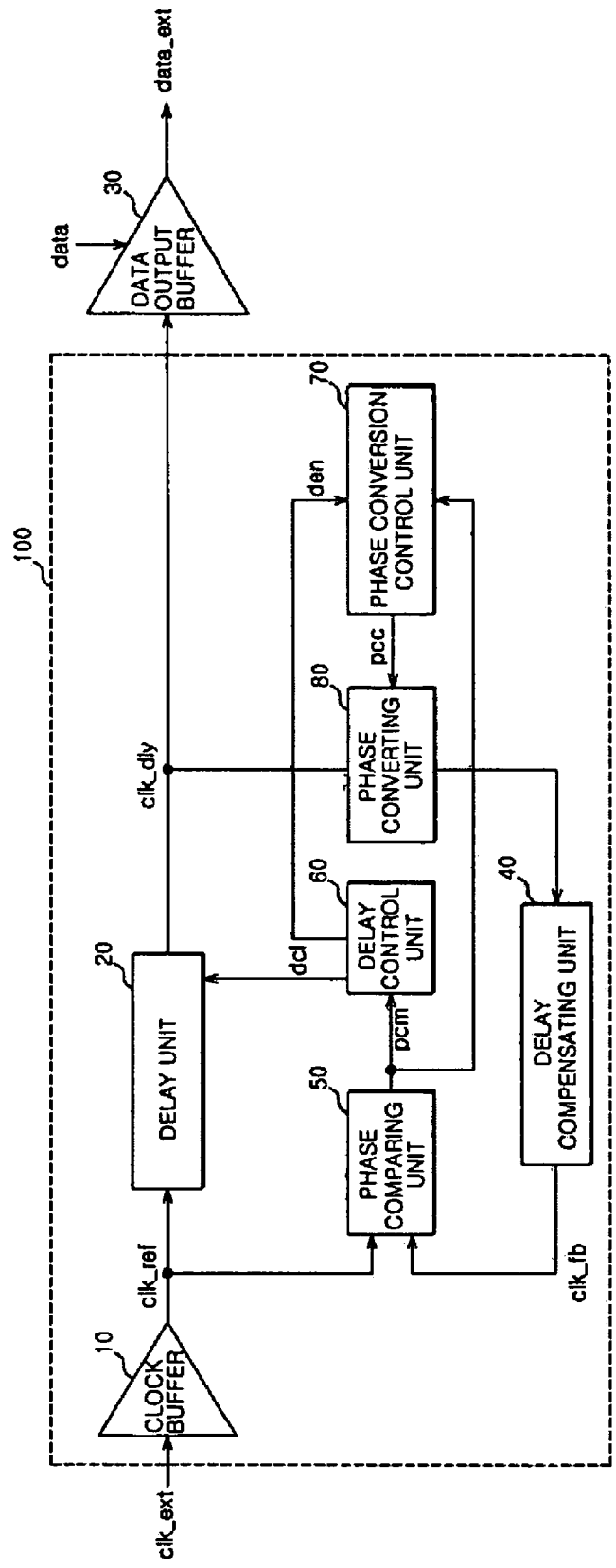
FIG. 3 is a block diagram illustrating a DLL circuit according to an embodiment of the present invention.

FIG. 3 is a block diagram illustrating the structure of a DLL circuit according to a first embodiment of the present invention.

As shown in FIG. 3, a DLL circuit 100 includes: a clock buffer 10 that changes the amplitude of an external clock clk_ext to generate a reference clock clk_ref, a delay unit 20 that delays the reference clock clk_ref in a push or pull manner in response to the input of a delay control signal dcl to generate a delay clock clk_dly, and transmits the generated delay clock clk_dly to a data output buffer 30 in synchronization with data transmitted from a memory cell; a phase conversion control unit 70 that latches an initial value of a phase comparison signal pcm in response to a delay enable signal den, and outputs the latched signal as a phase conversion control signal pcc; a phase converting unit 80 that controls the phase of the delay clock cly_dly in response to the phase conversion control signal pcc; a delay compensating unit 40 that delays a clock output from the phase converting unit 80 to generate a feedback clock clk_fb in order to compensate for a delay time produced by delay elements provided on a transmission path of the delay clock cly_dly to the outside of a semiconductor integrated circuit; a phase comparing unit 50 that compares the phase of the reference clock clk_ref with the phase of the feedback clock clk_fb to generate the phase comparison signal pcm; and a delay control unit 60 that generates the delay control signal dcl in response to the phase comparison signal pcm, and transmits the delay control signal dcl to the delay unit 20.

The delay enable signal den is generated inside the delay control unit 60, and is used to activate the delay control unit 60. In an initial operation of the DLL circuit 100, the delay enable signal den is disabled, and thus the delay control signal dcl is not generated, which causes the delay unit 20 not to delay the reference clock clk_ref. But, when the delay enable signal den is enabled, the delay control signal dcl is generated, which causes the delay unit 20 to delay the reference clock clk_ref.

When the external clock clk_ext is transmitted to the clock buffer 10 from outside the semiconductor integrated circuit having the DLL circuit 100, the clock buffer 10 converts the external clock clk_ext, that has a small amplitude, into the reference clock clk_ref having a large amplitude, and transmits the reference clock clk_ref to the delay unit 20. Then, the delay unit 20 delays the reference clock clk_ref by a predetermined amount of time and outputs the delayed clock as the delay clock cly_dly.

The delay compensating unit 40 has pre-calculated delay values of delay elements provided on a path through which the delay clock cly_dly is transmitted to the data output buffer 30. Therefore, the delay compensating unit 40 gives a predetermined delay time, for compensating for the delay values of the delay elements, to the clock transmitted from the phase converting unit 80 to generate the feedback clock clk_fb. Then, the phase comparing unit 50 detects the phase difference between the reference clock clk_ref and the feedback clock clk_fb to generate the phase comparison signal pcm. The delay control unit 60 generates the delay control signal dcl in response to the input of the phase comparison signal pcm. The delay control signal dcl instructs the delay unit 20 to perform a push or pull delay. The delay unit 20 gives a positive or negative delay time to the reference clock clk_ref on the basis of the delay control signal dcl.

The phase comparison signal pcm is also transmitted to the phase conversion control unit 70. The phase comparison signal pcm includes information about the phase relationship between the reference clock clk_ref and the feedback clock clk_fb in its voltage level. The phase conversion control unit 70 latches an initial value of the phase comparison signal pcm in response to the input of the delay enable signal den and outputs the latched signal as the phase conversion control signal pcc.

When the phase converting unit 80 receives information from the phase conversion control signal pcc indicating that the phase of the reference clock clk_ref leads the phase of the feedback clock clk_fb, the phase converting unit 80 inverts the delay clock clk_dly and transmits the inverted delay clock to the delay compensating unit 40. In contrast, when the phase converting unit 80 receives information from the phase conversion control signal pcc indicating that the phase of the feedback clock clk_fb leads the phase of the reference clock clk_ref, the phase converting unit 80 drives the delay clock cly_dly without inversion and transmits the driven delay clock to the delay compensating unit 40.

Figure 4:
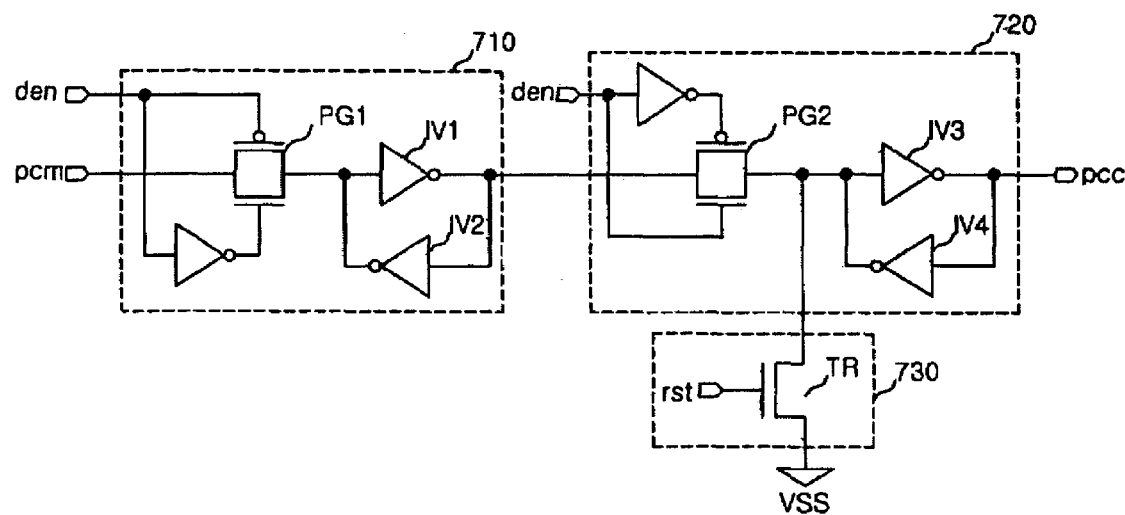
FIG. 4 is a circuit diagram of the phase conversion control unit shown in FIG. 3.

FIG. 4 shows a circuit diagram of the phase conversion control unit shown in FIG. 3.

The phase conversion control unit 70 includes: a first latch unit 710 that latches the phase comparison signal pcm in response to the input of the delay enable signal den; a second latch unit 720 that latches the signal transmitted from the first latch unit 710 in response to the input of the delay enable signal den; and an initializing unit 730 that initializes an output signal of the phase conversion control unit 70 in response to the input of a reset signal rst.

The first latch unit 710 includes a first pass gate PG1 that passes the phase comparison signal pcm on the basis of the delay enable signal den, and first and second inverters IV1 and IV2 that are formed in a latch structure with respect to the signal passing through the first pass gate PG1.

The second latch unit 720 includes a second pass gate PG2 that passes the signal transmitted from the first latch unit 710 on the basis of the delay enable signal den, and third and fourth inverters IV3 and IV4 that are formed in a latch structure with respect to the signal passing through the second pass gate PG2.

The initializing unit 730 includes a transistor TR that transmits the output signal of the second pass gate PG2 of the second latch unit 720 to the ground terminal according to whether the reset signal rst is enabled.

When the delay enable signal den input to the phase conversion control unit 70 having the above-mentioned structure is disabled, the first pass gate PG1 of the first latch unit 710 is turned on, and the second pass gate PG2 of the second latch unit 720 is turned off, which causes the phase comparison signal pcm to be stored in the latch structure formed by the first and second inverters IV1 and IV2.

On the other hand, when the delay enable signal den is enabled, the first pass gate PG1 of the first latch unit 710 is turned off, and the second pass gate PG2 of the second latch unit 720 is turned on, which causes the signal output from the first latch unit 710 to be stored in the latch structure formed by the third and fourth inverters IV3 and IV4.

The first and second latch units 710 and 720 are operated on the basis of the delay enable signal den for the following reason: since the phase comparison signal pcm is a variable signal, in the initial operation of the DLL circuit 100, the phase conversion control signal pcc is generated according to the value of the phase comparison signal pcm to prevent a frequent variation in the level of the phase conversion control signal pcc, thereby stabilizing the operation of the phase converting unit 80.

The initializing unit 730 is provided to initialize the phase conversion control signal pcc as a high-level signal on the basis of the reset signal rst in the initializing operation of the DLL circuit 100.

Figure 5:
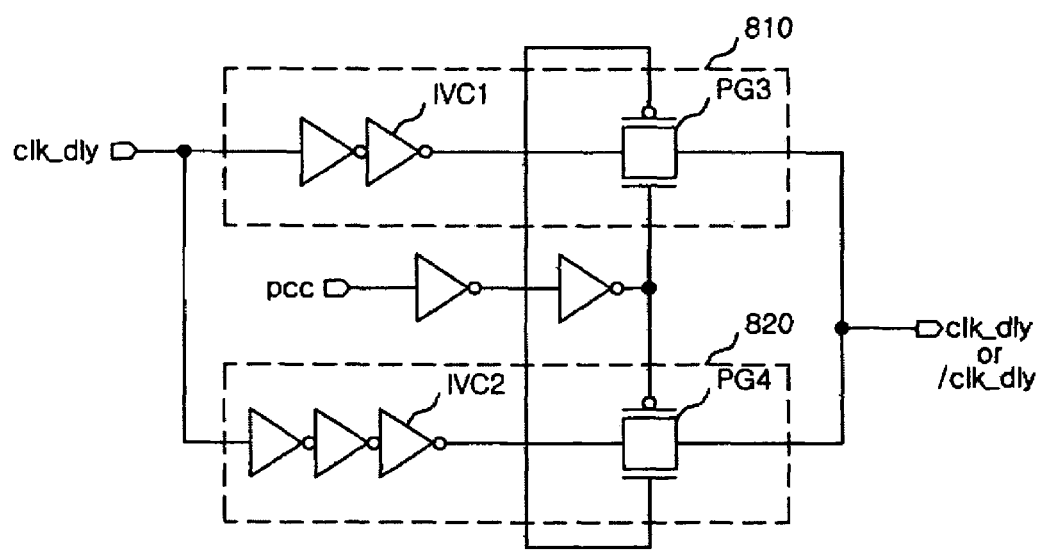
FIG. 5 is a circuit diagram of the phase converting unit shown in FIG. 3.

FIG. 5 is a circuit diagram of the phase converting unit shown in FIG. 3.

The phase converting unit 80 shown in FIG. 5 includes a non-inverting unit 810 that outputs the delay clock clk_dly without inversion on the basis of the phase conversion control signal pcc, and an inverting unit 820 that inverts the delay clock clk_dly on the basis of the phase conversion control signal pcc and outputs the inverted signal.

The non-inverting unit 810 includes a first inverter chain IVC1 composed of an even-numbered set of inverters connected in series to each other to output the delay clock cly_dly without inversion, and a third pass gate PG3 that passes the output signal of the first inverter chain IVC1 on the basis of the phase conversion control signal pcc.

The inverting unit 820 includes a second inverter chain IVC2 composed of an odd-numbered set of inverters connected in series to each other to invert the delay clock cly_dly, and a fourth pass gate PG4 that passes the output signal of the second inverter chain IVC2 on the basis of the phase conversion control signal pcc.

When the phase conversion control signal pcc is at a high level, the third pass gate PG3 of the non-inverting unit 810 is turned on, and the fourth gate PG4 of the inverting unit 820 is turned off, which causes the output signal of the phase converting unit 80 to have the same phase as the delay clock cly_dly. On the other hand, when the phase conversion control signal pcc is at a low level, the third pass gate PG3 of the non-inverting unit 810 is turned off, and the fourth gate PG4 of the inverting unit 820 is turned on, which causes the output signal of the phase converting unit 80 to be an inverted clock /cly_dly of the delay clock clk_dly.

That is, when the phase of the feedback clock clk_fb leads the phase of the reference clock clk_ref, the phase comparison signal pcm and the phase conversion control signal pcc are at a high level, and thus the output signal of the phase converting unit 80 becomes the same clock as the delay clock cly_dly. On the other hand, when the phase of the reference clock clk_ref leads the phase of the feedback clock clk_fb, the phase comparison signal pcm and the phase conversion control signal pcc are at a low level, and thus the output signal of the phase converting unit 80 becomes the inverted clock/clk_dly of the delay clock clk_dly.

Figure 6:
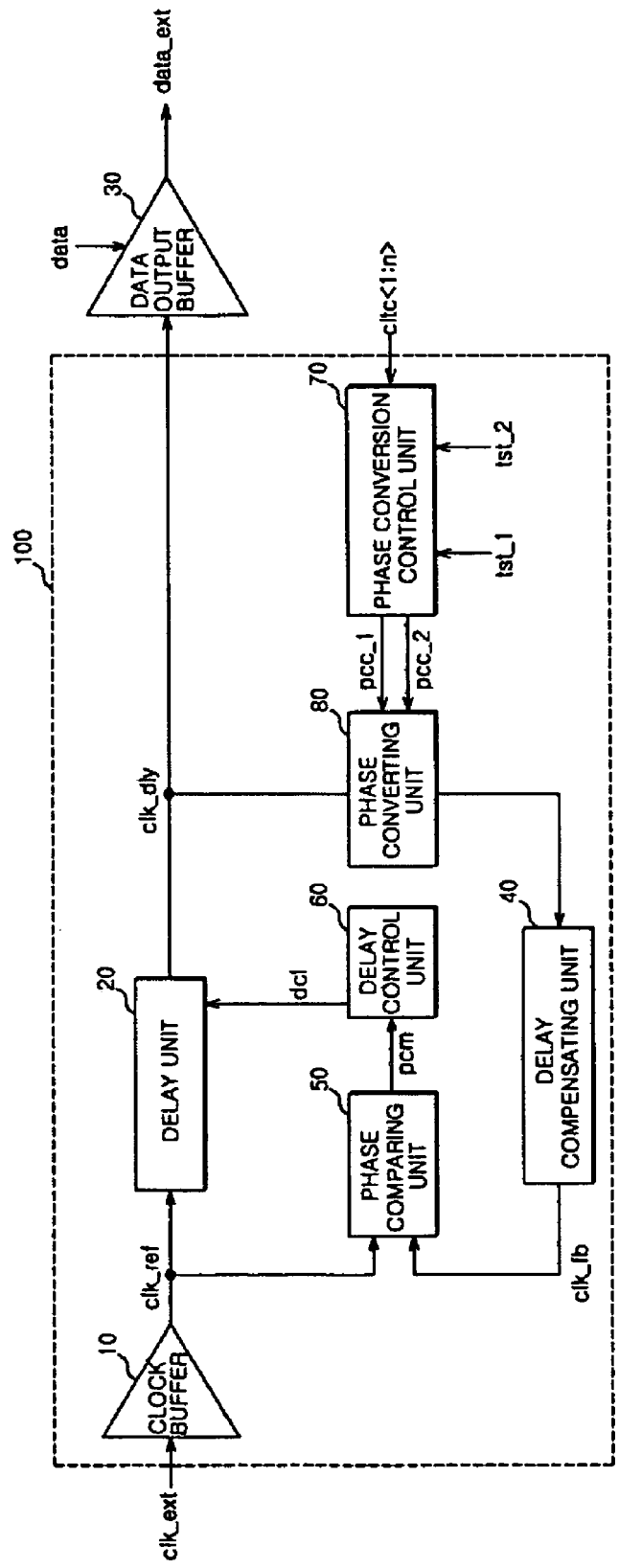
FIG. 6 is a block diagram illustrating a DLL circuit according to another embodiment of the present invention.

FIG. 6 is a block diagram illustrating the structure of a DLL circuit according to a second embodiment of the present invention.

As shown in FIG. 6, a DLL circuit 100 according to the second embodiment is similar to the DLL circuit according to the first embodiment shown in FIG. 3 except that the DLL circuit 100 includes: a phase conversion control unit 70 that generates first and second phase conversion control signals pcc_1 and pcc_2 according to whether n CAS latency signals cltc<1:n> generated according to the length of CAS latency or two test signals tst_1 and tst_2 are enabled; and a phase converting unit 80 that controls the phase of the delay clock cly_dly on the basis of whether the first and second phase conversion control signals pcc_1 and pcc_2 are enabled.

The CAS latency signals cltc<1:n> are used to indicate whether the frequency of the external clock clk_ext exceeds a predetermined frequency. When the length of the CAS latency of a semiconductor integrated circuit having the DLL circuit is larger than a predetermined length, which is a reference length, the external clock clk_ext may be regarded as a high-frequency signal. On the other hand, when the length of the CAS latency is smaller than the predetermined length, the external clock clk_ext may be regarded as a low-frequency signal. In this case, the CAS latency signals cltc<1:n> may be replaced with other signals in order to determine whether the external clock clk_ext is a high-frequency signal or a low-frequency signal.

When the frequency of the external clock clk_ext is higher than the predetermined frequency, the phase conversion control unit 70 enables the first phase conversion control signal pcc_1 and outputs the enabled signal. As the first phase conversion control signal pcc_1 is enabled, the phase converting unit 80 outputs the delay clock cly_dly without inverting the phase thereof. On the other hand, when the frequency of the external clock clk_ext is lower than the predetermined frequency, the phase conversion control unit 70 enables the second phase conversion control signal pcc_2 and outputs the enabled signal. As the second phase conversion control signal pcc_2 is enabled, the phase converting unit 80 inverts the delay clock cly_dly and outputs the inverted clock.

Tests are performed in various ways during the design of the DLL circuit. The DLL circuit may be configured such that it receives a test mode in order to selectively invert the delay clock cly_dly and transmit the inverted clock or the non-inverted clock to a delay compensating unit 40 in the test. Therefore, the phase conversion control unit 70 is configured to generate the first and second phase conversion control signals pcc_1 and pcc_2 according to the test mode, as well as according to whether the external clock clk_ext has a high frequency or a low frequency.

Figure 7:
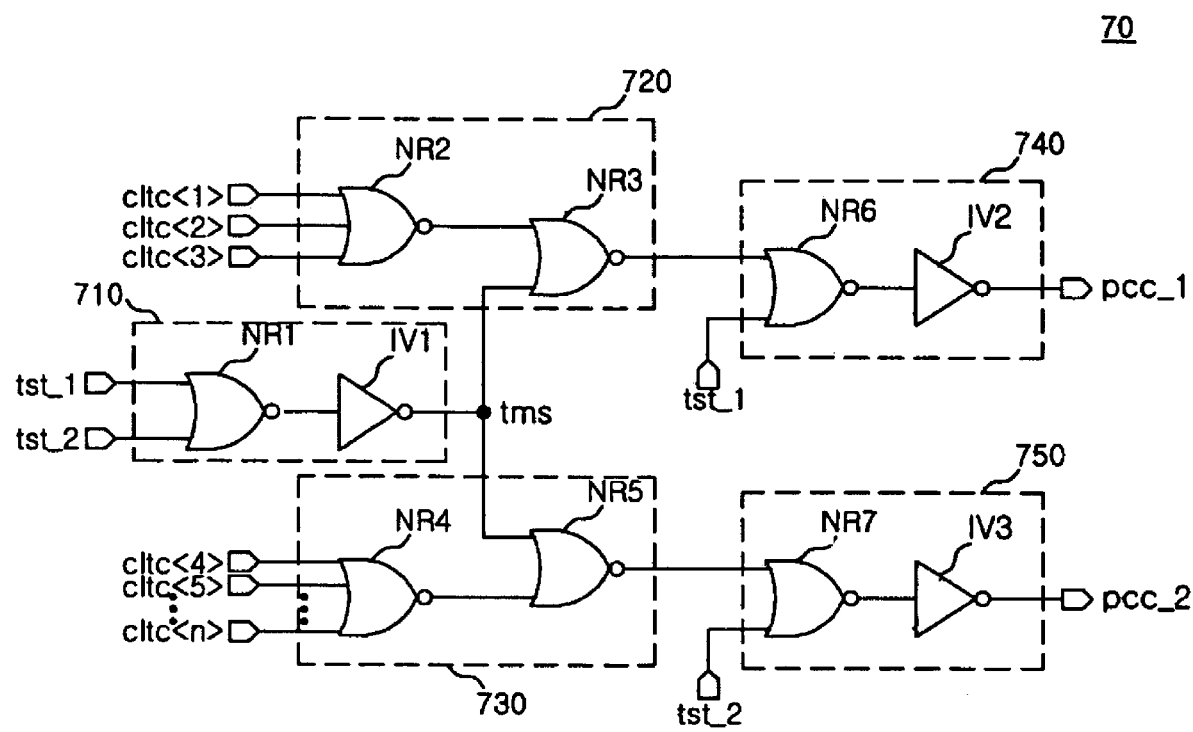
FIG. 7 is a circuit diagram of the phase conversion control unit shown in FIG. 6.

FIG. 7 is a circuit diagram of the phase conversion control unit shown in FIG. 6.

The phase conversion control unit 70 includes: a test mode setting unit 710 that receives the first and second test signals tst_1 and tst_2 to generate a test mode signal tms; a first signal input unit 720 to which the test mode signal tms and the first to third CAS latency signals cltc<1> to cltc<3> among the n CAS latency signals cltc<1:n> are input; a second signal input unit 730 to which the test mode signal tms and the fourth to n-th CAS latency signals cltc<4> to cltc<n> among the n CAS latency signals cltc<1:n> are input; a first signal generating unit 740 that combines the output signal of the first signal input unit 720 and the first test signal tst_1 to generate the first phase conversion control signal pcc_1; and a second signal generating unit 750 that combines the output signal of the second signal input unit 730 and the second test signal tst_2 to generate the second phase conversion control signal pcc_2.

The test mode setting unit 710 includes a first NOR gate NR1 to which the first and second test signals tst_1 and tst_2 are input, and a first inverter IV1 that inverts the output signal of the first NOR gate NR1 to output the test mode signal tms.

The first signal input unit 720 includes a second NOR gate NR2 to which the first to third CAS latency signals cltc<1> to cltc<3> are input, and a third NOR gate NR3 to which the output signal of the second NOR gate NR2 and the test mode signal tms are input.

The second signal input unit 730 includes a fourth NOR gate NR4 to which the fourth to n-th CAS latency signals cltc<4> to cltc<n> are input, and a fifth NOR gate NR5 to which the output signal of the fourth NOR gate NR4 and the test mode signal tms are input.

The first signal generating unit 740 includes a sixth NOR gate NR6 to which the output signal of the first signal input unit 720 and the first test signal tst_1 are input, and a second inverter IV2 that inverts the output signal of the sixth NOR gate NR6 to output the first phase conversion control signal pcc_1.

The second signal generating unit 750 includes a seventh NOR gate NR7 to which the output signal of the second signal input unit 730 and the second test signal tst_2 are input, and a third inverter IV3 that inverts the output signal of the seventh NOR gate NR7 to output the second phase conversion control signal pcc_2.

In this embodiment, it is assumed that, when the length of the CAS latency is smaller than a reference length of 4, that is, in the range of 1 to 3, the external clock clk_ext is a low-frequency signal and when the length of the CAS latency is in the range of 4 to n, the external clock clk_ext is a high-frequency signal. Meanwhile, in the actual implementation of a DLL circuit, the standard for dividing the low frequency and the high frequency may be different from the above, and the above is just an illustrative example for the convenience of explanation.

The first and second test signals tst_1 and tst_2 are applied in order to enable the first and second phase conversion control signals pcc_1 and pcc_2, respectively, when the DLL circuit is tested. Regardless of the n CAS latency signals cltc<1:n>, when the first test signal tst_1 is enabled, the first phase conversion control signal pcc_1 is enabled. When the second test signal tst_2 is enabled, the second phase conversion control signal pcc_2 is enabled.

According to the above-mentioned structure, if the test signals tst_1 and tst_2 are disabled, when the external clock clk_ext has a low frequency, any one of the first to third CAS latency signals cltc<1> to cltc<3> is enabled, which causes the first phase conversion control signal pcc_1 to be enabled. On the other hand, when the external clock clk_ext has a high frequency, any one of the fourth to n-th CAS latency signals cltc<4> to cltc<n> is enabled, which causes the second phase conversion control signal pcc_2 to be enabled.

Figure 8:
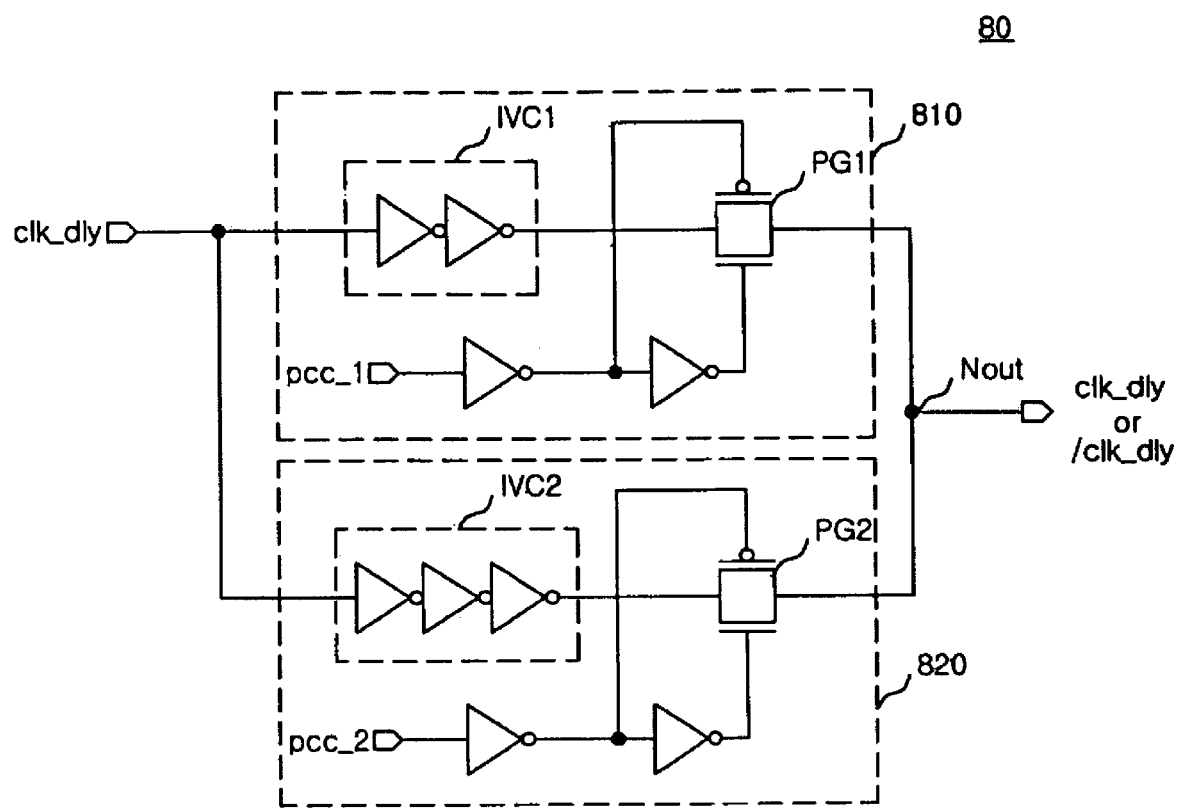
FIG. 8 is a circuit diagram of the phase converting unit shown in FIG. 6.

FIG. 8 is a circuit diagram of the phase converting unit shown in FIG. 6.

The phase converting unit 80 includes a non-inverting unit 810 that outputs the delay clock clk_dly without inversion when the first phase conversion control signal pcc_1 is enabled, and an inverting unit 820 that inverts the delay clock cly_dly and outputs the inverted signal when the second phase conversion control signal pcc_2 is enabled.

The non-inverting unit 810 includes a first inverter chain IVC1 which is composed of an even-numbered set of inverters connected in series to each other and to which the delay clock cly_dly is input; and a first pass gate PG1 that transmits the output signal of the first inverter chain IVC1 to an output node Nout when the first phase conversion control signal pcc_1 is enabled.

The inverting unit 820 includes a second inverter chain IVC2 which is composed of an odd-numbered set of inverters connected in series to each other and to which the delay clock clk_dly is input; and a second pass gate PG2 that transmits the output signal of the second inverter chain IVC2 to the output node Nout when the second phase conversion control signal pcc_2 is enabled.

When the first phase conversion control signal pcc_1 is enabled, the first pass gate PG1 is turned on, which causes the delay clock cly_dly to be transmitted to the output node Nout without being inverted. On the other hand, when the second phase conversion control signal pcc_2 is enabled, the second pass gate PG2 is turned on, which causes the delay clock clk_dly to be transmitted to the output node Nout with the phase thereof inverted. Then, the clock transmitted to the output node Nout is sent to the delay compensating unit 40, and the delay compensating unit 40 uses the clock to generate the feedback clock clk_fb.

Figure 9A:
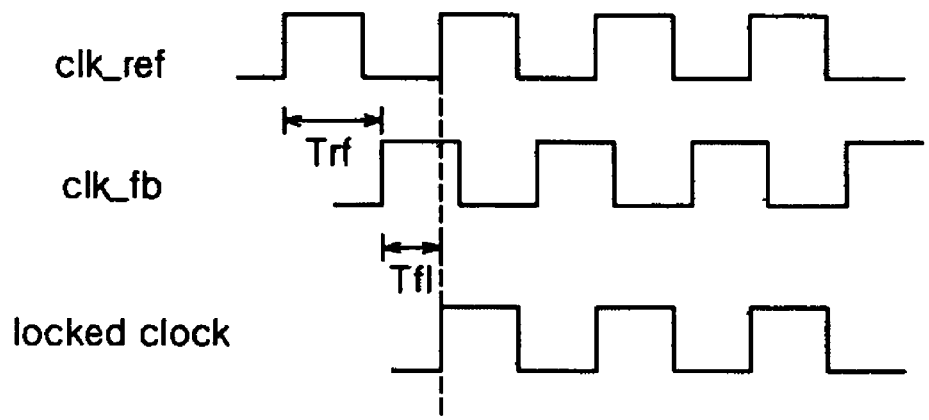
FIGS. 9A to 9C are timing charts illustrating the operation of the DLL circuit according to another embodiment of the present invention.
Figure 9B:
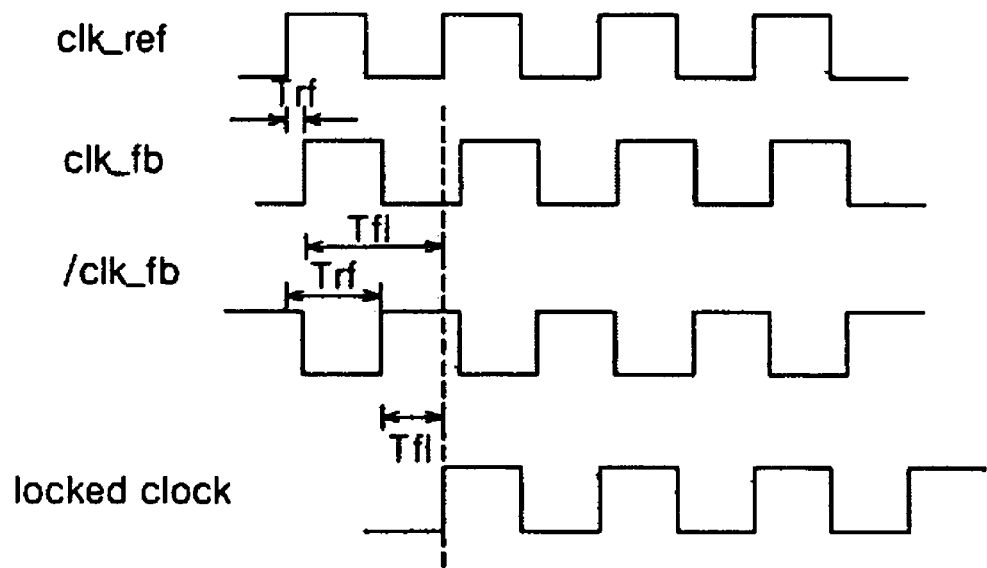

FIGS. 9A and 9B are timing charts illustrating the operation of the DLL circuit according to this embodiment of the present invention.

Figure 9C:
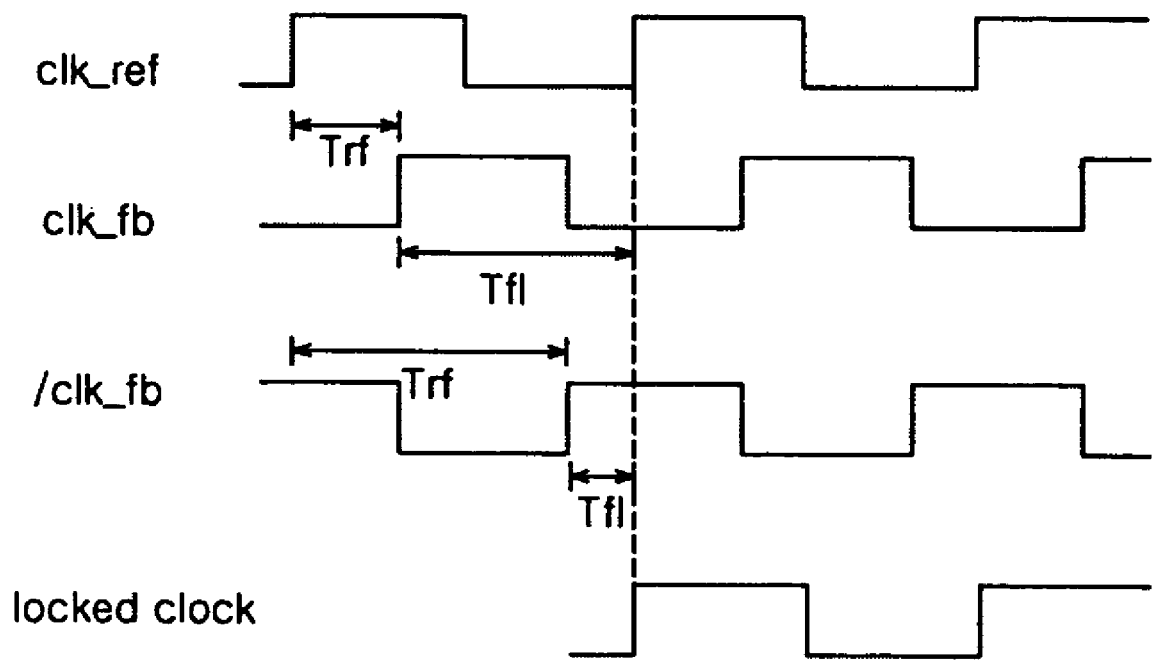

The reference clock clk_ref, the feedback clock clk_fb, and a locked clock having a rising edge time identical to those of the reference clock clk_ref and the feedback clock clk_fb are shown in FIGS. 9A and 9C.

FIG. 9A shows the feedback clock clk_fb whose phase leads the phase of the reference clock clk_ref when the external clock clk_ext is a high-frequency signal. In this case, a phase difference Trf between the reference clock clk_ref and the feedback clock clk_fb is larger than a phase difference Tfl between the feedback clock clk_fb and the locked clock.

FIG. 9B shows the reference clock clk_ref whose phase leads the phase of the feedback clock clk_fb when the external clock clk_ext is a high-frequency signal. In this case, the phase difference Trf between the reference clock clk_ref and the feedback clock clk_fb is smaller than the phase difference Tfl between the feedback clock clk_fb and the locked clock. That is, in FIG. 9B, the phase difference Tfl between the feedback clock clk_fb and the locked clock is larger than that shown in FIG. 9A, and thus a larger amount of delay time should be given to the reference clock clk_ref until the phase difference Tfl between the feedback clock clk_fb and the locked clock is zero. In the DLL circuit according to embodiments of the present invention, the inverted feedback clock/clk_fb is used instead of the feedback clock clk_fb to perform a clock delay locking operation. Therefore, the phase difference Tfl between the inverted feedback clock/clk_fb and the locked clock is smaller than the phase difference Trf between the reference clock clk_ref and the feedback clock clk_fb. Thus, it is possible to reduce the amount of delay time given to the reference clock clk_ref by the delay unit 20 and thus to perform a clock delay locking operation at high speed.

FIG. 9C shows the waveforms of the reference clock clk_ref and the feedback clock clk_fb when a low-frequency external clock clk_ext is input to the DLL circuit for generating the reference clock clk_ref and the feedback clock clk_fb. In this case, the phase difference Trf between the reference clock clk_ref and the feedback clock clk_fb is the same as shown in FIG. 9A. This is because the delay time given to the reference clock clk_ref by the delay unit 20 and the delay time given to the delay clock clk_dly by the delay compensating unit 40 are the same regardless of the frequency. The phase difference Tfl between the feedback clock clk_fb and the locked clock is considerably larger than that shown in FIG. 9A. That is, when the low-frequency clock is input to the DLL circuit, a larger amount of delay time should be given to the reference clock clk_ref until the phase difference Tfl between the feedback clock clk_fb and the locked clock is zero. In the DLL circuit according to embodiments of the present invention, the inverted feedback clock/clk_fb is used instead of the feedback clock clk_fb to perform a clock delay locking operation. Therefore, the phase difference Tfl between the inverted feedback clock/clk_fb and the locked clock is smaller than the phase difference Trf between the reference clock clk_ref and the feedback clock clk_fb. Thus, it is possible to reduce the amount of delay time given to the reference clock clk_ref by the delay unit 20 and thus to perform a clock delay locking operation at high speed.

As described above, the phase difference Tfl between the feedback clock clk_fb and the locked clock means the amount of delay time given to the reference clock clk_ref by the delay unit 20. In the related art, when the phase of the reference clock clk_ref leads the phase of the feedback clock clk_fb, a larger amount of delay time is given to the reference clock clk_ref. Meanwhile, in embodiments of the present invention, since the inverted feedback clock/clk_fb is used, the amount of delay time to be given to the reference clock clk_ref is reduced. As a result, it is possible to shorten the time required to perform a delay locking operation and thus to reduce the number of delay elements provided in the delay unit 20.

Accordingly, in the DLL circuit according to embodiments of the present invention, even when the phase of the reference clock leads the phase of the feedback clock in an operation of matching the phase of the reference clock with the phase of the feedback clock to generate a locked clock, it is possible to reduce the amount of delay time to be given to the feedback clock. In addition, it is possible to reduce the number of delay elements provided in a delay unit of the DLL circuit, resulting in an increase in area margin.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

As described above, in the DLL circuit and the method of controlling the DLL circuit according to the embodiments of the present invention, the phase of the internal clock is selectively changed according to the phase difference between the reference clock and the feedback clock, the frequency of an external clock, and a test mode to generate the feedback clock. Therefore, it is possible to reduce the amount of delay time given to lock the reference clock and the feedback clock and to reduce the number of delay elements provided in a delay unit, which results in an increase in area margin.

What is claimed is:

1. A delay locked loop (DLL) circuit comprising:
   a phase conversion control unit configured to receive a phase comparison signal, to latch an initial value of the phase comparison signal, to output the latched signal as a phase conversion control signal;
   a phase converting unit having one input terminal, configured to receive a delay clock through the input terminal and to output the delay clock as a controlled delay clock when a phase of a feedback clock leads a phase of a reference clock or to invert and output the delay clock as the controlled delay clock when the phase of the reference clock leads the phase of the feedback clock, in response to the phase conversion control signal;
   a delay compensating unit configured to delay the controlled delay clock and generate a feedback clock in order to compensate for the delay time given by delay elements provided on a transmission path of the delay clock to a data output buffer;
   a clock buffer configured to convert an amplitude of an external clock to generate the reference clock;
   a delay unit configured to delay the reference clock in a push or pull manner in response to input of a delay control signal to generate the delay clock;
   a phase comparing unit configured to compare the reference clock with the feedback clock to generate the phase comparison signal; and
   a delay control unit configured to generate the delay control signal in response to the phase comparison signal,
   wherein the phase comparison signal includes information about a phase difference between a reference clock and the feedback clock.

2. The DLL circuit of claim 1,
   wherein the phase conversion control unit comprises:
   a first latch unit configured to latch the phase comparison signal in response to the input of a delay enable signal to produce an output signal;
   a second latch unit configured to latch the output signal transmitted from the first latch unit in response to the input of the delay enable signal to produce an output signal; and
   an initializing unit configured to initialize the output signal of the second latch unit in response to input of a reset signal.

3. The DLL circuit of claim 2,
   wherein the first latch unit comprises:
   a pass gate configured to pass the phase comparison signal on the basis of the delay enable signal; and
   first and second inverters formed in a latch structure with respect to the phase comparison signal passing through the pass gate to provide an output signal.

4. The DLL circuit of claim 2,
   wherein the second latch unit comprises:
   a pass gate configured to pass the output signal transmitted from the first latch unit on the basis of the delay enable signal; and
   first and second inverters formed in a latch structure with respect to the output signal passing through the pass gate.

5. The DLL circuit of claim 4,
   wherein the initializing unit comprises a transistor configured to transmit the output signal of the pass gate of the second latch unit to a ground terminal according to whether or not the reset signal is enabled.

6. The DLL circuit of claim 1,
   wherein the phase converting unit comprises:
   a non-inverting unit configured to output the delay clock without inversion on the basis of the phase conversion control signal; and
   an inverting unit configured to invert the delay clock on the basis of the phase conversion control signal and output the inverted delay clock.

7. The DLL circuit of claim 6,
   wherein the non-inverting unit comprises:
   an inverter chain composed of an even-numbered set of inverters connected in series to each other to output the delay clock without inversion; and
   a pass gate to pass the output of the inverter chain on the basis of the phase conversion control signal.

8. The DLL circuit of claim 6,
   wherein the inverting unit comprises:
   an inverter chain composed of an odd-numbered set of inverters connected in series to each other, that inverts the delay clock and outputs the inverted delay clock; and
   a pass gate that passes the output of the inverter chain on the basis of the phase conversion control signal.

9. A delay locked loop (DLL) circuit comprising:
   a phase conversion control unit configured to receive a phase comparison signal whose level is determined by a phase relationship between a reference clock and a feedback clock, to output a phase conversion control signal, wherein a period of the reference clock is substantially same with the period of the feedback clock;
   a phase converting unit having an input terminal, configured to receive a delay clock through the input terminal, to invert and output the delay clock when a phase of the reference clock leads the phase of the feedback clock, or to output the delay clock without inversion when a phase of the feedback clock leads the phase of the reference clock on the basis of the phase conversion control signal;

a delay compensating unit to delay the delay clock output from the phase converting unit to generate the feedback clock in order to compensate for a delay time given by delay elements provided on a transmission path of the delay clock to a data output buffer, a clock buffer configured to convert an amplitude of an external clock to generate the reference clock;

a delay unit configured to delay the reference clock in a push or pull manner in response to input of a delay control signal to generate the delay clock;

a phase comparing unit configured to compare the reference clock with the feedback clock to generate the phase comparison signal; and a delay control unit configured to generate the delay control signal in response to the phase comparison signal.

10. The DLL circuit of claim 9, wherein the phase conversion control unit is configured to generate the phase conversion control signal having a same phase as the phase comparison signal after a delay enable signal is enabled and until the phase conversion control unit is reset.

11. The DLL circuit of claim 9, wherein the phase conversion control unit comprises:

a first latch unit configured to latch the phase comparison signal in response to the input of a delay enable signal;

a second latch unit configured to latch the phase comparison signal transmitted from the first latch unit in response to the input of the delay enable signal to provide an output signal; and an initializing unit configured to initialize the output signal of the second latch unit in response to the input of a reset signal.

12. The DLL circuit of claim 11, wherein the first latch unit comprises:

a pass gate configured to pass the phase comparison signal on the basis of the delay enable signal; and first and second inverters formed in a latch structure with respect to the phase comparison signal passing through the pass gate.

13. The DLL circuit of claim 11, wherein the second latch unit comprises:

a pass gate configured to pass the phase comparison signal transmitted from the first latch unit on the basis of the delay enable signal to provide an output signal; and first and second inverters formed in a latch structure with respect to the output signal passing through the pass gate.

14. The DLL circuit of claim 13, wherein the initializing unit comprises a transistor configured to transmit the output signal of the pass gate of the second latch unit to a ground terminal according to whether or not the reset signal is enabled.

15. The DLL circuit of claim 9, wherein the phase converting unit comprises:

a non-inverting unit configured to output the delay clock without inversion as the controlled delay clock on the basis of the phase conversion control signal; and an inverting unit configured to invert the delay clock on the basis of the phase conversion control signal and output the inverted delay clock as the controlled delay clock.

16. The DLL circuit of claim 15, wherein the non-inverting unit comprises:

an inverter chain composed of an even-numbered set of inverters connected in series to each other, that outputs the delay clock without inversion; and a pass gate that passes the output of the inverter chain on the basis of the phase conversion control signal.

17. The DLL circuit of claim 15, wherein the inverting unit comprises:

an inverter chain composed of an odd-numbered set of inverters connected in series to each other that inverts the delay clock and outputs the inverted delayed clock; and a pass gate that passes the output of the inverter chain on the basis of the phase conversion control signal.

* * * * *